(12) United States Patent
Kim

(10) Patent No.: US 12,516,211 B2
(45) Date of Patent: Jan. 6, 2026

(54) INK COMPOSITION AND ELECTRONIC DEVICE INCLUDING FILM FORMED USING THE INK COMPOSITION

(71) Applicant: Samsung Display Co., Ltd., Yongin-si (KR)

(72) Inventor: Joonhyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 938 days.

(21) Appl. No.: 17/721,123

(22) Filed: Apr. 14, 2022

(65) Prior Publication Data

US 2023/0095507 A1 Mar. 30, 2023

(30) Foreign Application Priority Data

Sep. 15, 2021 (KR) .................. 10-2021-0123367

(51) Int. Cl.
| | |
|---|---|
| *C09D 11/50* | (2014.01) |
| *C09D 11/037* | (2014.01) |
| *C09D 11/102* | (2014.01) |
| *C09K 11/06* | (2006.01) |
| *H01L 51/52* | (2006.01) |
| *H10K 50/854* | (2023.01) |
| *H10K 102/00* | (2023.01) |

(52) U.S. Cl.
CPC ............ *C09D 11/50* (2013.01); *C09D 11/037* (2013.01); *C09D 11/102* (2013.01); *C09K 11/06* (2013.01); *H10K 50/854* (2023.02); *H10K 2102/331* (2023.02)

(58) Field of Classification Search
None
See application file for complete search history.

(56) References Cited

U.S. PATENT DOCUMENTS

| | | |
|---|---|---|
| 7,982,812 B2 | 7/2011 | Rho et al. |
| 9,534,085 B2 | 1/2017 | Toda et al. |
| 10,519,366 B2 | 12/2019 | Qiu et al. |
| 10,670,962 B2 | 6/2020 | Park et al. |
| 10,689,511 B2 | 6/2020 | Ahn et al. |
| 10,947,403 B2 | 3/2021 | Isonaka et al. |
| 11,267,980 B2 | 3/2022 | Tangirala et al. |

(Continued)

FOREIGN PATENT DOCUMENTS

| | | | |
|---|---|---|---|
| EP | 3327342 A1 | * | 5/2018 |
| JP | 2021-054918 A | | 4/2021 |

(Continued)

OTHER PUBLICATIONS

Parthiban Ramasamy et al., Tunable, Bright, and Narrow-Band Luminescence from Colloidal Indium Phosphide Quantum Dots, Chemistry of Materials, 2017, pp. A-G, ACS Publications.

(Continued)

*Primary Examiner* — Tae H Yoon
(74) *Attorney, Agent, or Firm* — Womble Bond Dickinson (US) LLP

(57) ABSTRACT

An ink composition includes: a quantum dot including one or more ligands on a surface thereof; a first monomer including one or more epoxy groups; and a second monomer including one or more oxetane groups, wherein the one or more ligands include one or more polar moieties. An electronic apparatus includes a film formed utilizing the ink composition.

17 Claims, 4 Drawing Sheets

(56) References Cited

U.S. PATENT DOCUMENTS

| 11,618,833 B2 | 4/2023 | Yoshihara et al. |
| 2007/0043205 A1 | 2/2007 | Dias et al. |
| 2012/0001217 A1 | 1/2012 | Kang et al. |
| 2018/0282617 A1 | 10/2018 | Qiu et al. |
| 2019/0129302 A1 | 5/2019 | Youn et al. |
| 2020/0201124 A1 | 6/2020 | Lee et al. |
| 2020/0224047 A1 | 7/2020 | Yoshihara et al. |
| 2020/0231871 A1 | 7/2020 | Kim et al. |
| 2020/0347254 A1 | 11/2020 | Tangirala et al. |
| 2021/0024819 A1 | 1/2021 | Kang et al. |
| 2021/0108135 A1 | 4/2021 | Kang et al. |
| 2021/0206922 A1 | 7/2021 | Onishi |
| 2021/0261806 A1 | 8/2021 | Kim et al. |
| 2022/0213380 A1 | 7/2022 | Kang et al. |
| 2023/0098571 A1 | 3/2023 | Kim |

FOREIGN PATENT DOCUMENTS

| KR | 10-2006-0012294 A | 2/2006 |
| KR | 10-2007-0094679 A | 9/2007 |
| KR | 10-2009-0036373 A | 4/2009 |
| KR | 10-2012-0002946 A | 1/2012 |
| KR | 10-2015-0133795 A | 11/2015 |
| KR | 10-2016-0028276 A | 3/2016 |
| KR | 10-2017-0086566 A | 7/2017 |
| KR | 10-2017-0137882 A | 12/2017 |
| KR | 10-2018-0081002 A | 7/2018 |
| KR | 10-2018-0092671 A | 8/2018 |
| KR | 10-2018-0097145 A | 8/2018 |
| KR | 10-2019-0102857 A | 9/2019 |
| KR | 10-2019-0108710 A | 9/2019 |
| KR | 10-2019-0112630 A | 10/2019 |
| KR | 10-2020-0030542 A | 3/2020 |
| KR | 10-2020-0073982 A | 6/2020 |
| KR | 10-2020-0073992 A | 6/2020 |
| KR | 10-2020-0074185 A | 6/2020 |
| KR | 10-2020-0076770 A | 6/2020 |
| KR | 10-2020-0090493 A | 7/2020 |
| KR | 10-2020-0112624 A | 10/2020 |
| KR | 10-2020-0114465 A | 10/2020 |
| KR | 10-2020-0140350 A | 12/2020 |
| KR | 10-2021-0011227 A | 2/2021 |
| KR | 10-2021-0012828 A | 2/2021 |
| KR | 10-2021-0030787 A | 3/2021 |
| KR | 10-2224055 B1 | 3/2021 |
| KR | 10-2021-0044043 A | 4/2021 |
| KR | 10-2021-0044045 A | 4/2021 |
| KR | 10-2021-0048934 A | 5/2021 |
| KR | 10-2021-0109112 A | 9/2021 |
| KR | 10-2021-0154588 A | 12/2021 |
| KR | 10-2023-0041155 A | 3/2023 |
| WO | WO 2018/123103 A1 | 7/2018 |

OTHER PUBLICATIONS

International Search Report issued Nov. 8, 2023 in PCT Application No. PCT/KR2023/011613, 3 pages.
Ujala Farooq et al; "Toughening of Epoxy Systems with Interpenetrating Polymer Network (IPN): A Review"; Polymers 2020, 12, 1908; pp. 1-29.
Marco Sangermano et al; "Interpenetrated hybrid thiol-ene/epoxy UV-cured network withenhanced impact resistance" Prog. Org. Coat. 2015, 78, 244-248.

* cited by examiner

INK COMPOSITION AND ELECTRONIC DEVICE INCLUDING FILM FORMED USING THE INK COMPOSITION

CROSS-REFERENCE TO RELATED APPLICATION

This application claims priority to and the benefit of Korean Patent Application No. 10-2021-0123367, filed on Sep. 15, 2021, in the Korean Intellectual Property Office, the disclosure of which is incorporated herein by reference in its entirety.

BACKGROUND

1. Field

One or more embodiments relate to an ink composition and an electronic apparatus including a film formed utilizing the ink composition.

2. Description of the Related Art

Light-emitting devices are devices that convert electrical energy into light energy. Examples of such light-emitting devices include an organic light-emitting device utilizing an organic material for an emission layer, a quantum dot light-emitting device utilizing quantum dots for an emission layer, and/or the like. Such a light-emitting device may be included in various suitable electronic apparatuses, such as a display apparatus.

To implement color in a display apparatus, a method that can further increase color purity of red (R), green (G), and/or blue (B) by utilizing a color conversion layer has been proposed, wherein the color conversion layer includes a color-converting luminescent material that absorbs light of a specific wavelength and converts it into light of a different wavelength.

Such a color conversion layer may be formed by an inkjet printing method. Accordingly, there is a desire for a material suitable for usage in an inkjet printing method.

SUMMARY

Aspects according to one or more embodiments are directed toward an ink composition and an electronic apparatus including a film formed utilizing the ink composition, wherein the ink composition has improved adhesion force, reduced curing shrinkage, and a lower film manufacturing cost. However, these objectives are examples only, and do not limited the scope of the present disclosure.

Additional aspects will be set forth in part in the description, which follows and, in part, will be apparent from the description, or may be learned by practice of the presented embodiments of the disclosure.

According to one or more embodiments, an ink composition includes a quantum dot including one or more ligands on a surface thereof,
   a first monomer including one or more epoxy groups, and
   a second monomer including one or more oxetane groups,
   wherein the one or more ligands include one or more polar moieties.

According to one or more embodiments, an electronic apparatus includes a film formed by utilizing the ink composition and a light-emitting device that includes a first electrode, a second electrode, and an interlayer between the first electrode and the second electrode.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
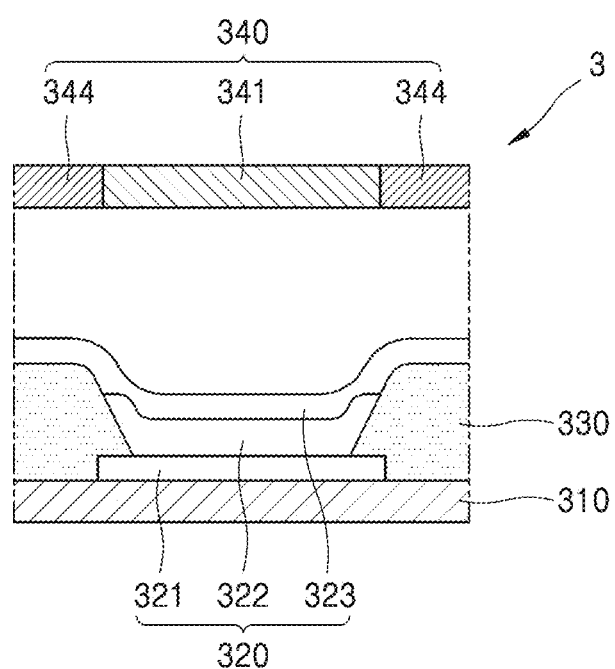
FIG. 1 is a schematic view of a light-emitting apparatus according to an embodiment.

Reference will now be made in more detail to embodiments, examples of which are illustrated in the accompanying drawings, wherein like reference numerals refer to like elements throughout, and duplicative descriptions thereof may not be provided in the specification. In this regard, the present embodiments may have different forms and should not be construed as being limited to the descriptions set forth herein. Accordingly, the embodiments are merely described, by referring to the drawings, to explain aspects of the present description. As used herein, the term "and/or" includes any and all combinations of one or more of the associated listed items. Throughout the disclosure, the expression "at least one of a, b or c" and "at least one of a, b and c" each indicate only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The present disclosure may, however, be embodied in many different forms and should not be construed as limited to the embodiments set forth herein.

Hereinafter, embodiments of the present disclosure will be described in more detail with reference to the accompanying drawings. The same or corresponding components will be denoted by the same reference numerals, and thus redundant description thereof will not be provided.

An expression used in the singular encompasses the expression of the plural, unless it has a clearly different meaning in the context.

In Examples, the prefix "poly" refers to the plural number of 2 or more.

As used herein, the terms "comprise", "include", "have", and the like, specify the presence of stated features and/or components, and do not exclude the presence or addition of one or more other features and/or components.

It will be understood that when a layer, region, or component is referred to as being "on" or "onto" another layer, region, or component, it may be directly or indirectly formed on the other layer, region, or component. For example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

In the present specification, the term "room temperature" refers to about 25° C.

Ink Composition

According to embodiments of the present disclosure, an ink composition includes: a quantum dot including one or more ligands on a surface thereof; a first monomer including one or more epoxy groups; and a second monomer including one or more oxetane groups, wherein the one or more ligands include one or more polar moieties.

In an embodiment, the first monomer may include 1, 2, 3, 4, or 5 epoxy groups. In one or more embodiments, the first monomer may include 2, 3, 4, or 5 epoxy groups.

In an embodiment, the first monomer may have, in a molecular structure thereof, a cyclic structure and/or a linear or branched structure. In one or more embodiments, the first monomer may have, in a molecular structure thereof, a cyclic structure and a linear or branched structure.

In one or more embodiments, the first monomer may include a linear, branched, or cyclic $C_1$-$C_{20}$ alkane group (e.g., alkyl group); a linear, branched, or cyclic alkene group (e.g., alkenyl group); or a $C_6$-$C_{20}$ arene group (e.g., aryl group).

In one or more embodiments, the first monomer may include an ether group or an ester group.

In an embodiment, the first monomer may be represented by Formula 1-1 or Formula 1-2:

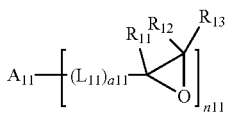

Formula 1-1

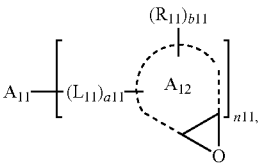

Formula 1-2 wherein, in Formulae 1-1 and 1-2, $A_{11}$ may be a linear, branched, or cyclic $C_1$-$C_{20}$ alkane group (e.g., alkyl group); a linear, branched, or cyclic alkene group (e.g., alkenyl group); or a $C_6$-$C_{20}$ arene group (e.g., aryl group), $A_{12}$ may be a cyclic $C_1$-$C_{20}$ alkane group (e.g., alkyl group) or a cyclic $C_1$-$C_{20}$ alkene group (e.g., alkenyl group), $L_{11}$ may be

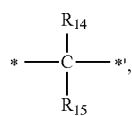

*—O—*, or

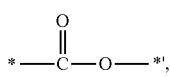

a11 may be 0, 1, 2, 3, 4, 5, 6, 7, 8, 9, or 10, $R_{11}$ to $R_{15}$ may each independently be hydrogen, deuterium, a halogen, or a linear, branched, or cyclic $C_1$-$C_{20}$ alkyl group, b11 may be an integer from 1 to 12, n11 may be 1, 2, 3, 4, or 5, and

* and *' may each indicate a binding site to a neighboring atom.

In one or more embodiments, when the first monomer includes a linear or branched alkane group (e.g., alkyl group), examples of the first monomer may include (e.g., may be) the following compounds, but embodiments of the present disclosure are not limited thereto:

1) mono-functional compound: butyl glycidyl ether, isobutyl glycidyl ether, 2-ethylhexyl glycidyl ether, hexadecyl glycidyl ether, triethyleneglycol diglycidyl ether, allyl glycidyl ether, polypropylene glycol glycidyl ether, glycidyl ester neodecanonate, and/or the like;

2) di-functional compound: 1,4-butanediol diglycidyl ether, ethylene glycol diglycidyl ether, 1,6-hexanediol diglycidyl ether, propylene glycol diglycidyl ether, diethylene glycol diglycidyl ether, neopentyl glycol diglycidyl ether, 1,4-cyclohexanedimethanol diglycidyl ether, polypropylene glycol diglycidyl ether, and/or the like; and 3) tri-functional or poly-functional compound: glycerol triglycidyl ether, trimethyrolpropane triglycidyl ether, pentaerythritol polyglycidyl ether, dipentaerythritol polyglycidyl ether, alkyl polyol-type (or polyol-kind) polyglycidyl ether, and/or the like.

In one or more embodiments, when the first monomer includes a cyclic group, examples of the first monomer may include (e.g., may be) the following compounds, but embodiments of the present disclosure are not limited thereto:

cyclohexyldimethanol glycidyl ether, dicyclopentadiene glycidyl ether, 1,2-epoxy-4-vinylcyclohexane, 3',4'-epoxycyclohexylmethyl 3,4-epoxycyclohexyl carboxylate, 3',4'-epoxycyclohexylmethyl-3,4-epoxycyclohexyl carboxylate denaturated caprolactone, naphthyl glycidyl ether, cresyl glycidyl ether, para t-butylphenol glycidyl ether, thiodiphenyl diglycidyl ether, 3-alkylphenol glycidyl ether, o-phenylphenol glycidyl ether, benzyl glycidyl ether, o-butylphenyl glycidyl ether, resorcinol diglycidyl ether, bisphenol A diglycidyl ether, bisphenol F diglycidyl ether, bisphenol S diglycidyl ether, 2,2"-diarylbisphenol A diglycidyl ether, propylene oxide added bisphenol A diglycidyl ether, 2-biphenyl glycidyl ether, triglycidyl aminophenol, tetraglycidyl methylenedianiline, and/or the like.

In one or more embodiments, the commercially available compound of the first monomer may include, for example, the KF EPIOL product line manufactured by Kukdo Finechem Co., Ltd, such as ME-100, ME101, ME103, ME105, ME106, ME102, ME700, ME701, ME702, ME704, DE200, DE 201, DE202, DE203, DE204, DE205, DE207, DE208, DE209, DE213, DE214, DE215, DE216, DE703, DE704, PE300, PE311, PE411, PE412, and/or PE510; the EPODIL product line manufactured by EVONIK Company, such as 733, 741, 742, 746, 747, 748, 749, 750, 757, 759, 761, 777, and/or 781; the CELLOXIDE product line manufactured by DICELL Company, such as 2021P, 2000, 2081, and/or 8010; the HELOXY product line manufactured by HEXION, such as DB, HD, and/or WF, and the EPICOTE Resin product line of the same company, such as 215, 232, 235, 238, 240, 246, 320, 827, 828EL, 862, and/or 896; the GLYCIROL ED product line manufactured by Adeka Company, such as ED-502, ED-509, ED-529, ED-503, ED-506, ED-523T, ED-505, ED-508, and/or ED-512EX, and the EP product line of the same company, such as EP-4400, EP-4520, EP4530, and/or EP-4005; the EPICLON product line manufactured by DIC Company, such as 520, HP-4032SS, TGAP BPFDGE, BPADGE, HP-4770, EXA-4750, and/or EXA-7250; and/or the like.

The first monomer may be utilized alone, or two or more different kinds (e.g., types) of the first monomer may be utilized in combination.

A molecular weight of the first monomer may be in a range of about 100 g/mol to about 800 g/mol.

An amount of the first monomer may be, based on 100 parts by weight of the ink composition, about 20 parts or more by weight and less than 70 parts by weight, for example, about 20 parts or more by weight and less than 50 parts by weight. When the amount of the first monomer is within these ranges, the ink composition may maintain the viscosity constant (e.g., at a constant value) and have improved curing degree and improved cross-linking degrees during curing.

In an embodiment, the second monomer may include 1, 2, 3, 4, or 5 oxetane groups.

In an embodiment, the second monomer may have, in a molecular structure thereof, a cyclic structure and/or a linear or branched structure. In one or more embodiments, the second monomer may have, in a molecular structure thereof, a cyclic structure and a linear or branched structure.

In one or more embodiments, the second monomer may include a linear, branched, or cyclic $C_1$-$C_{20}$ alkane group (e.g., alkyl group); a linear, branched, or cyclic alkene group (e.g., alkenyl group); or a $C_6$-$C_{20}$ arene group (e.g., aryl group).

In one or more embodiments, the second monomer may include an ether group or an ester group.

In an embodiment, the second monomer may be represented by Formula 2-1 or Formula 2-2:

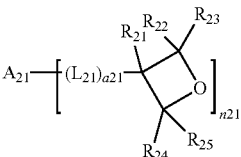

Formula 2-1

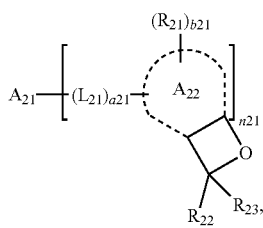

Formula 2-2 wherein, in Formulae 2-1 and 2-2,
$A_{21}$ may be a linear, branched, or cyclic $C_1$-$C_{20}$ alkane group (e.g., alkyl group); a linear, branched, or cyclic alkene group (e.g., alkenyl group); or a $C_6$-$C_{20}$ arene group (e.g., aryl group),
$A_{22}$ may be a cyclic $C_1$-$C_{20}$ alkane group (e.g., alkyl group) or a cyclic $C_1$-$C_{20}$ alkene group (e.g., alkenyl group), $L_{21}$ may be

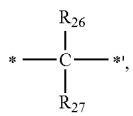

*—O—*', or

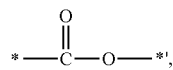

a21 may be 0, 1, 2, 3, 4, 5, 6, 7, 8, 9, or 10,
$R_{21}$ to $R_{27}$ may each independently be hydrogen, deuterium, a halogen, or a linear, branched, or cyclic $C_1$-$C_{20}$ alkyl group,
b21 may be an integer from 1 to 12,
n21 may be 1, 2, 3, 4, or 5, and
* and *' may each indicate a binding site to a neighboring atom.

In one or more embodiments, examples of the second monomer may include (e.g., may be) 1,4-bis[(3-ethyl-3-oxetanyl methoxy)methyl]benzene, 1,4-bis[(3-methyl-3-oxetanyl methoxy)methyl]benzene, 3-methyl-3-glycidyl oxetane, 3-ethyl-3-glycidyl oxetane, di[1-ethyl(3-oxetanyl)]methylether, 3-ethyl-3-hydroxymethyl oxetane, 3-ethyl-3-[(3-ethoxyoxetane-3-yl)methoxy]oxetane, 3-ethyl-3-phenoxymethyl oxetane, 3-ethyl-3-[(2-ethylhexyloxy)methyl]oxetane, oxetanyl-silicate, phenolnovolac oxetane, and/or the like, but embodiments of the present disclosure are not limited thereto.

In one or more embodiments, the commercially available compound of the second monomer may include, for example, the ARON OXETANE product line manufactured by TOAGOSEI Company, such as OXT-221, OXT-101, OXT-121, OXT-212, OXT-211, CHOX, and/or OX-SC; the ETERNACOLL product line manufactured by Ube Company, such as EHO, OXBP, OXTP, and/or OXMA; and/or the like, but embodiments of the present disclosure are not limited thereto.

The second monomer may be utilized alone, or two or more different kinds (e.g., types) of the second monomer may be utilized in combination.

A molecular weight of the second monomer may be in a range of about 100 g/mol to about 800 g/mol.

An amount of the second monomer may be, based on 100 parts by weight of the ink composition, about 5 parts or more by weight and less than 90 parts by weight, for example, about 10 parts or more by weight and less than 50 parts by weight. When the amount of the second monomer is within these ranges, the ink composition may maintain the viscosity constant (e.g., at a constant value) and have improved curing degree and/or improved cross-linking degree during curing.

An amount of the second monomer may be in a range of about 20 parts by weight to about 350 parts by weight based on 100 parts by weight of the first monomer. When the ratio of the first monomer to the second monomer is within these ranges, the ink composition may have further improved adhesion force and/or improved peel-off force.

In an embodiment, the ink composition may further include a third monomer including one or more epoxy groups, wherein the first monomer and the third monomer may be different from each other. In the present specification, the third monomer may be understood with reference to the description of the first monomer, unless specifically defined otherwise.

In an embodiment, the first monomer may include a linear or branched $C_1$-$C_{20}$ alkane group (e.g., alkyl group) or a linear or branched $C_1$-$C_{20}$ alkene group (e.g., alkenyl group), and the third monomer may include a cyclic $C_1$-$C_{20}$ alkane group (e.g., alkyl group), a cyclic $C_1$-$C_{20}$ alkene group (e.g., alkenyl group), or a $C_6$-$C_{20}$ arene group (e.g., aryl group).

In one or more embodiments, the first monomer may be represented by Formula 1-1, and the third monomer may be represented by Formula 1-2:

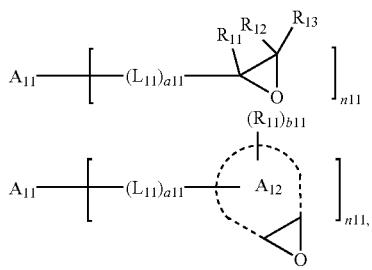

wherein, in Formulae 1-1 and 1-2, $A_{11}$ may be a linear or branched $C_1$-$C_{20}$ alkane group (e.g., alkyl group) or a linear or branched $C_1$-$C_{20}$ alkene group (e.g., alkenyl group), $A_{12}$ may be a cyclic $C_1$-$C_{20}$ alkane group (e.g., alkyl group) or a cyclic $C_1$-$C_{20}$ alkene group (e.g., alkenyl group), $L_{11}$ may be

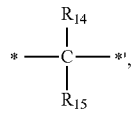

*—O—*', or

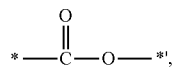

a11 may be 0, 1, 2, 3, 4, 5, 6, 7, 8, 9, or 10, $R_{11}$ to $R_{15}$ may each independently be hydrogen, deuterium, a halogen, or a linear, branched, or cyclic $C_1$-$C_{20}$ alkyl group, b11 may be an integer from 1 to 12, n11 may be 1, 2, 3, 4, or 5, and

* and *' may each indicate a binding site to a neighboring atom.

The third monomer may be utilized alone, or two or more different kinds (e.g., types) of the third monomer may be utilized in combination.

A molecular weight of the third monomer may be in a range of about 100 g/mol to about 800 g/mol.

An amount of the third monomer may be, based on 100 parts by weight of the ink composition, about 5 parts or more by weight and less than 50 parts by weight, for example, about 10 parts or more by weight and less than 50 parts by weight. When the amount of the third monomer is within these ranges, the ink composition may maintain the viscosity constant (e.g., at a constant value) and have improved curing degree and/or improved cross-linking degree during curing.

An amount of the third monomer may be in a range of about 20 parts by weight to about 500 parts by weight based on 100 parts by weight of the first monomer. When the ratio of the first monomer to the third monomer is within these ranges, the ink composition may have further improved adhesion force and/or further improved peel-off force.

In an embodiment, each of the first monomer to the third monomer included in the ink composition may be a monomer that can form a film by a ring-opening polymerization mechanism. For example, when the ink composition forms a film by a ring-opening polymerization mechanism, compared to the related art carbon-carbon double bond polymerization mechanism, film shrinkage, generation of stress due to the film shrinkage, and bending or deterioration of a device due to the stress may be relatively reduced. In some embodiments, the ink composition may have relatively high adhesion force to a substrate, such as glass.

In one or more embodiments, each of the first monomer to the third monomer included in the ink composition may be a monomer that can form a film by a cationic-polymerization mechanism. For example, when the ink composition forms a film by a cationic-polymerization mechanism, compared to the related art acryl radical polymerization mechanism, no polymerization inhibition phenomenon by ambient oxygen may occur. Accordingly, costs for maintaining a working environment (e.g., suitable for conducting the polymerization to form the film) may be reduced, and the necessity of (or reliance on) an operator for the safety management may be also relatively low.

In an embodiment, the ink composition may include a solvent in an amount of less than about 2 parts by weight based on 100 parts by weight of the ink composition. In one or more embodiments, the ink composition may substantially not include a solvent. In this regard, the ink composition may be a solventless (or solvent-free) ink composition.

When the ink composition does not include a solvent, the ink composition may be suitable for application to an inkjet process. In more detail, in the case of an ink composition including a solvent (e.g., a solvent-based ink composition), to form a film with a target thickness, an inkjet process needs to be repeatedly performed until the thickness (e.g., the thickness of the deposited ink composition prior to drying) is about five times a thickness of a film formed utilizing the solventless ink composition. In this regard, such an ink composition including a solvent is not suitable for precise film formation, and problems, for example, color mixture (e.g., color mixing) between pixels during formation of a color conversion member, may occur. In some embodiments, when an ink composition including a solvent is utilized, phenomena of nozzle drying by solvent volatilization (e.g., evaporation), nozzle clogging, and/or the like may occur. Also, an organic solvent may remain in a formed film (e.g., at a residual amount), so that deterioration of other organic layers may be affected or reliability may be adversely affected by out-gassing.

In an embodiment, the ink composition may further include a polymerization initiator. For example, the ink composition may further include a photopolymerization initiator and/or a thermal polymerization initiator. Such a polymerization initiator is to accelerate polymerization and improve a curing speed, and any suitable polymerization initiator (e.g., those suitable in the art) may be utilized without particular limitation.

In an embodiment, examples of the photopolymerization initiator may include (e.g., may be): an onium-type (e.g., onium-based) photopolymerization initiator including (e.g., consisting of) a cation moiety including aromatic sulfonium, aromatic iodonium, aromatic diazonium, aromatic ammonium, and/or the like and an anion moiety including $BF_4^-$, $PF_6^-$, $SbF_6^-$, and/or the like; and/or a non-ionic photopolymerization initiator, such as nitrobenzyl ester, sulfonic acid derivative, phosphoric acid ester, phenolsulfonic acid ester, diazonaphthoquinone, N-hydroxyimidesulfonate, and/or the like.

Examples of the onium-type (or onium-kind) photopolymerization initiator including aromatic sulfonium may include (e.g., may be) bis(4-(diphenylsulfonio)phenyl)sulfide bishexafluorophosphate, bis(4-(diphenylsulfonio)phenyl)sulfide bishexafluoroantimonate, bis(4-(diphenylsulfonio)phenyl)sulfide bistetrafluoroborate, bis(4-(diphenylsulfonio)phenyl)sulfide tetrakis(pentafluorophenyl)borate, diphenyl-4-(phenylthio)phenylsulfonium hexafluorophosphate, diphenyl-4-(phenylthio)phenylsulfonium hexafluoro antimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis (pentafluorophenyl)borate, bis(4-(di(4-(2-hydroxyethoxy))phenylsulfonio)phenyl)sulfide bishexafluorophosphate, bis(4-(di(4-(2-hydroxyethoxy))phenylsulfonio)phenyl)sulfide bishexafluoroantimonate, bis(4-(di(4-(2-hydroxyethoxy))phenylsulfonio)phenyl)sulfide bistetrafluoroborate, bis(4-(di(4-(2-hydroxyethoxy))phenylsulfonio)phenyl)sulfide tetrakis(pentafluorophenyl)borate, and/or the like, but embodiments of the present disclosure are not limited thereto.

Examples of the onium-type or kind photopolymerization initiator including aromatic iodonium may include (e.g., may be) diphenyliodonium hexafluorophosphate, diphenyliodonium hexafluoroantimonate, diphenyliodonium tetrafluoroborate, diphenyliodonium tetrakis (pentafluorophenyl)borate, bis(dodecylphenyl)iodonium hexafluorophosphate, bis(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate, 4-methylphenyl-4-(1-methylethyl)phenyliodonium tetrakis(pentafluorophenyl)borate, and/or the like, but embodiments of the present disclosure are not limited thereto.

Examples of the onium-type or kind photopolymerization initiator including aromatic diazonium may include (e.g., may be) phenyldiazonium hexafluorophosphate, phenyldiazonium hexafluoro antimonate, phenyldiazonium tetrafluoroborate, phenyldiazonium tetrakis(pentafluorophenyl)borate, and/or the like, but embodiments of the present disclosure are not limited thereto.

Examples of the onium-type or kind photopolymerization initiator including aromatic ammonium may include (e.g., may be) 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyanopyridinium hexafluorophosphate, 1-(naphthylmethyl)-2-cyanopyridinium hexafluoroantimonate, 1-(naphthylmethyl)-2-cyanopyridinium tetrafluoroborate, 1-(naphthylmethyl)-2-cyanopyridinium tetrakis(pentafluorophenyl) borate, and/or the like, but embodiments of the present disclosure are not limited thereto.

The commercially available photopolymerization initiator may include (e.g., may be), for example, DTS-200 manufactured by Midori Company; UVI6990 or UVI6974 manufactured by Union Carbide Company; SP-150 or SP-170 manufactured by Adeca Company; FC-508 or FC-512 manufactured by 3M Company; Omnicat 250, Omnicat 261, Omnicat 270, and/or Omnicat 290 manufactured by IGM Resin Company; BLUESIL PI2074 manufactured by Bluestar Silicones Company; CPI-100P, CPI-101A, CPI-200K, and/or CPI-210S manufactured by SAN-APRO Company, and/or the like.

In an embodiment, an example of the thermal polymerization initiator is an onium-type or kind (e.g., onium-based) thermal polymerization initiator including (e.g., consisting of) a cation moiety including sulfonium, phosphonium, diazonium, iodonium, ammonium, and/or the like and an anion moiety including $BF_4^-$, $PF_6^-$, $SbF_6^-$, and/or the like.

Examples of the onium-type or kind thermal polymerization initiator including sulfonium may include (e.g., may be) triphenylsulfonium tetrafluoroborate, triphenylsulfonium hexafluoroantimonate, triphenylsulfonium hexafluoroarsenic, tri(4-methoxyphenyl)sulfonium hexafluoroarsenic, diphenyl(4-phenylthiophenyl) sulfonium hexafluoroarsenic, and/or the like, but embodiments of the present disclosure are not limited thereto.

Examples of the onium-type or kind thermal polymerization initiator including phosphonium may include (e.g., may be) ethyltriphenylphosphonium hexafluoroantimonate, tetrabutylphosphonium hexafluoroantimonate, and/or the like, but embodiments of the present disclosure are not limited thereto.

Examples of the onium-type or kind thermal polymerization initiator including ammonium may include (e.g., may be) dimethylphenyl(4-methoxybenzyl)ammonium hexafluorophosphate, dimethylphenyl(4-methoxybenzyl) ammonium hexafluoroantimonate, dimethylphenyl(4-methoxybenzyl)ammonium tetrakis(pentafluorophenyl)borate, dimethylphenyl(4-methylbenzyl)ammonium hexafluorophosphate, dimethylphenyl(4-methylbenzyl)ammonium hexafluoroantimonate, dimethylphenyl(4-methylbenzyl)ammonium hexafluorotetrakis(pentafluorophenyl) borate, methylphenyldibenzylammonium hexafluoroantimonate, methylphenyldibenzylammonium hexafluorophosphate, methylphenyldibenzylammonium tetrakis(pentafluorophenyl) borate, phenyltribenzylammoniumtetrakis(pentafluorophenyl) borate, dimethylphenyl(3,4-dimethylbenzyl) ammoniumtetrakis(pentafluorophenyl) borate, N,N-dimethyl-N-benzylanilinium hexafluoroantimonate, N,N-diethyl-N-benzylanilinium tetrafluoroborate, N,N-dimethyl-N-benzylpyridinium hexafluoroantimonate, N,N-diethyl-N-benzylpyridinium trifluoromethanesulfonic acid, and/or the like, but embodiments of the present disclosure are not limited thereto.

The commercially available thermal polymerization initiator may include (e.g., may be), for example, Opton CP-66 and/or Opton CP-77 manufactured by ADEKA; SAN-AID SI-60, SAN-AID SI-80, SAN-AID SI-100, SAN-AID SI-110, and/or SAN-AID SI-180 manufactured by SAN-SHIN; and/or CXC-1612, CXC-1738, and/or CXC-1821 manufactured by KING INDUSTRIES.

In an embodiment, the ink composition may include, as the polymerization initiator, sulfonium or iodonium.

In an embodiment, an amount of the polymerization initiator may be, based on 100 parts by weight of the ink composition, in a range of about 0.1 parts by weight to about 10 parts by weight, and for example, about 0.5 parts by weight to about 5 parts by weight. In one or more embodiments, the amount of the polymerization initiator may be, based on 100 parts by weight of the first monomer and the second monomer, in a range of about 0.1 parts by weight to about 10 parts by weight, and for example, about 0.5 parts by weight to about 5 parts by weight. In one or more embodiments, the amount of the polymerization initiator may be, based on 100 parts by weight of the first monomer to the third monomer, in a range of about 0.1 parts by weight to about 10 parts by weight, and for example, about 0.5 parts by weight to about 5 parts by weight. When the amount of the polymerization initiator is within the ranges above, a working speed may be fast enough and non-uniformity of a film upon an excessively fast curing reaction may be reduced.

In an embodiment, the ink composition may include the quantum dot. The quantum dot is not particularly limited as long as it absorbs and emits light, and examples of the quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include (e.g., may be): a binary compound, such as CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Examples of the Group III-V semiconductor compound may include (e.g., may be): a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. The Group III-V semiconductor compound may further include a Group II element. Examples of the Group III-V semiconductor compound further including a Group II element may include (e.g., may be) InZnP, InGaZnP, InAlZnP, and/or the like.

Examples of the Group III-VI semiconductor compound may include (e.g., may be): a binary compound, such as GaS, GaSe, $Ga_2Se_3$, GaTe, InS, InSe, $In_2S_3$, $In_2Se_3$, InTe, and/or the like; a ternary compound, such as $InGaS_3$, $InGaSe_3$, and/or the like; or any combination thereof.

Examples of the Group I-III-VI semiconductor compound may include (e.g., may be): a ternary compound, such as AgInS, $AgInS_2$, CuInS, $CuInS_2$, $CuGaO_2$, $AgGaO_2$, $AgAlO_2$, and/or the like; or any combination thereof.

Examples of the Group IV-VI semiconductor compound may include (e.g., may be): a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include: a single element compound, such as Si, Ge, and/or the like; a binary compound, such as SiC, SiGe, and/or the like; or any combination thereof.

Each element included in a multi-element compound, such as the binary compound, the ternary compound, and/or the quaternary compound, may exist in a particle thereof at a substantially uniform concentration or a non-substantially uniform concentration.

The quantum dot may have: a homogeneous single structure; dual structure, such as a core-shell structure, a gradient structure, and/or the like; a core-shell-shell triple structure; or a mixed structure thereof. For example, a material included in the core and a material included in the shell may be different from each other.

Examples of the shell of the quantum dot may include (e.g., may be) a metal oxide, a metalloid oxide, a non-metal oxide, a semiconductor compound, or any combination thereof. Examples of the metal oxide, the metalloid oxide, or the non-metal oxide may include (e.g., may be): a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; a ternary compound, such as $MgAl_2O_4$, $CoFe_2O_4$, $NiFe_2O_4$, $CoMn_2O_4$, and/or the like; or any combination thereof. Examples of the semiconductor compound may include (e.g., may be), as described herein, a Group II-VI semiconductor compound; a Group III-V semiconductor compound; a Group III-VI semiconductor compound; a Group I-III-VI semiconductor compound; a Group IV-VI semiconductor compound; or any combination thereof.

In an embodiment, the core may include one or more materials selected from CdSe, CdS, InP, InGaP, ZnS, ZnSe, CdTe, CdSeTe, CdZnS, PbSe, AgInZnS, and ZnO, but embodiments of the present disclosure are not limited thereto.

In an embodiment, the shell may include one or more materials selected from CdSe, ZnSe, ZnS, ZnTe, CdTe, PbS, TiO, SrSe, and HgSe, but embodiments of the present disclosure are not limited thereto.

The quantum dot may include, on a surface thereof, one or more ligands, and each of the one or more ligands may include one or more polar moieties. As the monomers included in the ink composition have relatively high polarity, when the polarity of the quantum dot is low, homogeneous disperse of quantum dot in the ink composition may be difficult. Thus, to increase the polarity of the quantum dot, such a ligand including one or more polar moieties may be utilized.

In an embodiment, the polar moiety may include an oxyalkylene group. In one or more embodiments, the polar moiety may include a substituted or unsubstituted oxymethylene group or a substituted or unsubstituted oxyethylene group.

In one or more embodiments, the polar moiety may include tetramethoxy ethylene glycol.

In an embodiment, the quantum dot and the ligand may be chemically bonded via at least one group selected from a hydroxy group, a mercapto group, a carboxyl group, an ester group, and a phosphoric acid group.

In an embodiment, the ligand may further include a linear, branched, or cyclic $C_1$-$C_{20}$ alkane group (e.g., alkyl group); a linear, branched, or cyclic $C_1$-$C_{20}$ alkene group (e.g., alkenyl group); a $C_6$-$C_{20}$ arene group (e.g., aryl group); or a $C_1$-$C_{20}$ heteroarene group (e.g., heteroaryl group).

The quantum dot may be prepared by acts (e.g., steps) including: dispersing in a non-polar solvent a quantum dot (e.g., a plurality of quantum dots) including a polar moiety-free ligand on a surface thereof; adding a polar moiety-including ligand and stirring the mixed dispersion; and extracting the supernatant by centrifugation and drying it to obtain a quantum dot including one or more ligands including one or more polar moieties on a surface thereof.

In an embodiment, an amount of the quantum dots may be, based on 100 parts by weight of the ink composition, in a range of about 20 parts by weight to 60 parts by weight, for example, about 25 parts by weight to about 50 parts by weight, or, about 30 parts by weight to about 45 parts by weight.

In an embodiment, the ink composition may further include a scatterer. The scatterer is not limited as long as it scatters and diffuses light that is not absorbed by the quantum dot, and allows the scattered light to be absorbed again by the quantum dot. For example, the scatterer may increase the amount of light absorbed by the quantum dot, so as to increase light conversion efficiency of a color conversion layer.

In an embodiment, the scatterer may include a plurality of inorganic particles having different particle diameters.

In an embodiment, the scatterer may include any one selected from $BiFeO_3$, $Fe_2O_3$, $WO_3$, $TiO_2$, SiC, $BaSO_4$, $BaTiO_3$, ZnO, $ZrO_2$, ZrO, $Ta_2O_5$, $MoO_3$, $TeO_2$, $Nb_2O_5$, $Fe_3O_4$, $V_2O_5$, $Cu_2O$, BP, $Al_2O_3$, $In_2O_3$, $SnO_2$, $Sb_2O_3$, $CaCO_3$, and ITO, or any combination thereof.

In an embodiment, an average particle diameter of the scatterer may be in a range of about 150 nm to about 250 nm, for example, about 180 nm to about 230 nm. When the average particle diameter of the scatterer is within these ranges, the light scattering effect may be further improved and the light conversion efficiency of the light conversion layer may be increased.

In an embodiment, the scatterer may have a refractive index of greater than 1.5.

As described above, the scatterer may include inorganic particles having various suitable particle diameters, so that the refractive index of the scatterer may increase. In this regard, a difference in the refractive index between the scatterer and around (e.g., surrounding) members may also increase, and accordingly, the probability of total reflection of blue light may increase, thereby increasing an absorption rate of blue light and improving light conversion efficiency.

In an embodiment, an amount of the scatterer may be, based on 100 parts by weight of the ink composition, in a range of about 0.1 parts by weight to about 20 parts by weight, for example, about 1 parts by weight to about 10 parts by weight. When the amount of the scatterer is within these ranges, usage of the scatterer may result in the improved light conversion efficiency. Also, due to the inclusion of the quantum dots at an appropriate or suitable ratio, the light conversion efficiency does not decrease.

In an embodiment, the ink composition may further include various suitable additives, and thus, the ink composition may undergo various suitable modifications. In an embodiment, the ink composition may include, as an additive, a surfactant, an adhesion promoter, a sensitizer, a stabilizer, or any combination thereof.

In one or more embodiments, the ink composition may further include a surfactant, such as a fluorine-based surfactant and/or a silicone-based surfactant, to improve coating properties and leveling performance.

The fluorine-based surfactant may have a weight average molecular weight in a range of about 4,000 g/mol to about 10,000 g/mol, for example, about 6,000 g/mol to about 10,000 g/mol. Also, the fluorine-based surfactant may have a surface tension in a range of about 18 mN/m to about 23 mN/m (measured in 0.1% propylene glycol monomethyl ether acetate (PGMEA) solution). When the weight average molecular weight and the surface tension of the fluorine-based surfactant are within these ranges, leveling performance may be further improved, occurrence of stains during coating may be prevented or reduced, and relatively less bubbles are generated, resulting in fewer film defects.

The commercially available fluorine-based surfactant may include, for example, MEGAFACE® product line manufactured by DIC Company, such as F-114, F-251, F-253, F-281, F-410, F-430, F-477, F-510, F-551, F-552, F-553, F-554, F-555, F-556, F-557, F-558, F-559, F-560, F-561, F-562, F-563, F-565, F-568, F-569, F-570, F-572, F-574, F-575, F-576, R-4, R-41, R-94, RS-56, RS-72-K, RS-75, RS-76-E, RS-76-NS, RS-78, RS-90, and/or DS-21; Fluorosurfactant® product line manufactured by 3M Company, such as FC-135, FC-170C, FC-430, FC-431, FC-4430, and/or FC-4433; SURFLON® product line manufactured by AGC Company, such as S-211, S-221, S-231, S-232, S-241, S-242, S-243, S-420, S-431, S-386, S-611, S-647, S-651, S-653, S-656, S-658, and/or F693; CPASTONE® product line manufactured by DuPONT Company, such as FS-30, FS-65, FS-31, FS-3100, FS-34, FS-35, FS-50, FS-51, FS-60, FS-61, FS-63, FS-64, FS-81, FS-22, and/or FS-83; and/or the like, but embodiments of the present disclosure are not limited thereto.

For example, the surfactant may include a silicon-based surfactant. The commercially available silicon-based surfactant may include, for example, DYNOL product line manufactured by EVONIK Company, such as DYNOL 360, DYNOL 604, DYNOL 607, DYNOL 800, and/or DYNOL 810, and TEGO product line manufactured by the same company, such as Twin 4000, Twin 4100, and/or Twin 4200; BYK-300, BYK-301, BYK-302, BYK-306, BYK-307, BYK-310, BYK-313, BYK-315N, BYK-320, BYK-322, BYK-323, BYK-325N, BYK-326, BYK-327, BYK-329, BYK-330, BYK-331, BYK-332, BYK-333, BYK-342, BYK-345, BYK-346, BYK-347, BYK-348, BYK-350, BYK-352, BYK-354, BYK-355, BYK-356, BYK-358N, BYK-359, BYK-360P, BYK-361N, BYK-364P, BYK-366P, BYK-368P, BYK-370, BYK-375, BYK-377, BYK-378, BYK-381, BYK-390, BYK-392, and/or BYK-394 manufactured by BYK Company; and/or the like, but embodiments of the present disclosure are not limited thereto.

An amount of the surfactant may be, based on 100 parts by weight of the ink composition, in a range of about 0.01 parts by weight to about 5 parts by weight, for example, about 0.1 parts by weight to about 2 parts by weight.

In an embodiment, the ink composition may further include an adhesion promoter.

The adhesion promoter may include, for example, a titanium-based adhesion promoter, an aluminum-based adhesion promoter, or a silane-based adhesion promoter.

Examples of the silane-based adhesion promoter may include (e.g., may be): an epoxy-based silane binder, such as 3-glycidyloxypropyl trimethoxysilane, 3-glycidyloxypropyl triethoxysilane, 3-glycidyloxypropyl (dimethoxy)methylsilane, and/or 2-(3,4-epoxycyclohexyl)ethyl trimethoxysilane; a mercapto-based silane binder, such as 3-mercaptopropyl trimethoxysilane, 3-mercaptopropyl triethoxysilane, 3-mercaptopropyl methyldimethoxysilane, and/or 11-mercaptoundecyl trimethoxysilane; an amino-based silane binder, such as 3-aminopropyl trimethoxysilane, 3-aminopropyl triethoxysilane, 3-aminopropyl dimethoxymethylsilane, N-phenyl- 3-aminopropyl trimethoxysilane, N-methylaminopropyl trimethoxysilane, N-(2-aminoethyl)-3-aminopropyl trimethoxysilane, and/or N-(2-aminoethyl)-3-aminopropyl dimethoxymethylsilane; a ureido-based silane binder, such as 3-ureido propyl triethoxysilane; a vinyl-based silane binder, such as vinyl trimethoxysilane, vinyl triethoxysilane, and/or vinyl methyldiethoxy silane; a styryl-based silane binder, such as p-styryl trimethoxysilane; an acrylate-based silane binder, such as 3-acryloxypropyl trimethoxysilane and/or 3-metacryloxypropyl trimethoxysilane; an isocyanate-based silane binder such as 3-isocyanate propyl trimethoxysilane; a sulfide-based silane binder, such as bis(triethoxysilylpropyl)disulfide and/or bis(triethoxysilylpropyl)tetrasulfide; phenyl trimethoxysilane; metacryloxypropyl trimethoxysilane; imidazolesilane; triazinesilane; and/or the like, but embodiments of the present disclosure are not limited thereto. The commercially available adhesion promoter may include (e.g., may be), for example, KBM-1003, KBE-1003, KBM-303, KBM-402, KBM-403, KBE-402, KBE-403, KBM-1403, KBM-502, KBM-503, KBE-502, KBE-503, KBM-5103, KBM602, KBM-603, KBM-903, KBE-903, KBE-9103P, KBM-573, KBM-575, KBE-585, KBE-9007N, KBM-9659, KBM-802, and/or KBM-803 manufactured by Shin Etsu Company; SIA02000.0, SIS6964.0, SIA08591.0, SIS6964.0, SIB1824.5, SIA0591.0, SIT8192.6, SIG5840.0, SIB1834.0, SIE4668.0, SIA0599.2, SIC2295.5, SIB1833.0, SIA0611.0, SIG5840.0, SIB1140.0, SIB1833.0, SIS6990.0, SIB1832.0, SIE4670.0, SIM6487.4, SIB1828.0, SIM6487.4, SIS6994.0, SIB1140.0, SIM6476.0, SIU9058.0, SII6455.0, SIT8717.0, SSP-055, SIA0780.0, and/or VEE-005 manufactured by Gelest Company; SA6112C, SA1003O, SA0004O, SA3003O, SA4003O, SA1003M, SB1003M, SB1013E, SB1022M, SB2003M, and/or SB3003M manufactured by KCC Company; and/or the like, but embodiments of the present disclosure are not limited thereto.

In an embodiment, an amount of the adhesion promoter may be, based on 100 parts by weight of the ink composition, in a range of about 0.1 parts by weight to about 10 parts by weight, for example, about 0.5 parts by weight to about 5 parts by weight. In one or more embodiments, the amount of the adhesion promoter may be, based on 100 parts by weight of the total amounts of the first monomer and the second monomer in the ink composition, in a range of about 0.1 parts by weight to about 10 parts by weight, for example, about 0.5 parts by weight to about 5 parts by weight. In one or more embodiments, the amount of the adhesion promoter may be, based on 100 parts by weight of the total amounts of the first monomer, the second monomer, and the third monomer in the ink composition, in a range of about 0.1 parts by weight to about 10 parts by weight, for example, about 0.5 parts by weight to about 5 parts by weight.

In an embodiment, the ink composition may further include a sensitizer. The sensitizer may further improve polymerization initiation efficiency of the polymerization initiator, and thus may serve to further accelerate a curing reaction of the ink composition.

The sensitizer may serve to supplement curability of rays having a long wavelength of 300 nm or more. The sensitizer may be a compound that absorbs light having a wavelength in a range of about 250 nm to about 405 nm, about 300 nm to about 405 nm, or about 350 nm to about 395 nm.

Examples of the sensitizer may include (e.g., may be): an anthracene-based compound, such as 9,10-dimethoxyanthracene, 9,10-diethoxyanthracene, 9,10-dibutoxyanthracene, and/or 2-ethyl-9,10-dimethoxyanthracene; a benzophenone-based compound, such as 4,4-bis(dimethylamino) benzophenone, 4,4-bis(diethylamino) benzophenone, 2,4,6-trimethylaminobenzophenone, methyl-o-benzoylbenzoate, 3,3-dimethyl-4-methoxybenzophenone, and/or 3,3,4,4-tetra(t-butylperoxycarbonyl)benzophenone; a ketone-based compound, such as dimethoxyacetophenone, diethoxy acetophenone, 2-hydroxy-2-methyl-1-phenylpropane-1-one, and/or propanone; a fluorenone-based compound, such as 9-fluorenone, 2-chloro-9-fluorenone, and/or 2-methyl-9-fluorenone; a thioxanthone-based compound, such as thioxanthone, 2,4-diethyl thioxanthone, 2-chloro thioxanthone, 1-chloro-4-propyloxy thioxanthone, isopropyl thioxanthone (ITX), and/or diisopropyl thioxanthone; a xanthone-based compound, such as xanthone and/or 2-methyl xanthone; an anthraquinone-based compound, such as anthraquinone, 2-methyl anthraquinone, 2-ethyl anthraquinone, t-butyl anthraquinone, and/or 2,6-dichloro-9,10-anthraquinone; an acridine-based compound, such as 9-phenylacridine, 1,7-bis(9-acrydinyl)heptane, 1,5-bis(9-acrydinylpentane), and/or 1,3-bis(9-acrydinyl)propane; a dicarbonyl compound, such as benzyl, 1,7,7-trimethyl-bicyclo[2,2,1]heptane-2,3-dione, and/or 9,10-phenanthrenequinone; a phosphine oxide-based compound, such as 2,4,6-trimethylbenzoyl diphenylphosphine oxide and/or bis(2,6-dimethoxybenzoyl)-2,4,4-trimethylpentyl phosphine oxide; a benzoate-based compound, such as methyl-4-(dimethylamino)benzoate, ethyl-4-(dimethylamino) benzoate, and/or 2-n-butoxyethyl-4-(dimethylamino)benzoate; an amino-based compound, such as 2,5-bis(4-diethylaminobenzal)cyclopentanone, 2,6-bis(4-diethylaminobenzal)cyclohexanone, and/or 2,6-bis(4-diethylaminobenzal)-4-methyl-cyclopentanone; a coumarin-based compound, such as 3,3-carbonylvinyl-7-(diethylamino)coumarin, 3-(2-benzothiazolyl)-7-(diethylamino)coumarin, 3-benzoyl-7-(diethylamino) coumarin, and/or 3-benzoyl-7-methoxy-coumarin; a chalcone compound, such as 4-diethylamino chalcone and/or 4-azidebenzalacetophenone; 2-benzoylmethylen; 3-methyl-beta-naphthothiazoline; and/or the like, but embodiments of the present disclosure are not limited thereto.

An amount of the sensitizer may be, based on 100 parts by weight of the ink composition, in a range of about 0.05 parts by weight to about 3 parts by weight, for example, about 0.1 parts by weight to about 1 parts by weight. When the amount of the sensitizer is within these ranges, sensitization effect may be sufficiently obtained, and light may be transmitted to a deep part of the ink composition.

In an embodiment, the ink composition may further include a stabilizer, such as an antioxidant, a UV absorber, and/or an anti-aggregation agent. The stabilizer may be utilized to increase the period of usage of the ink composition.

Examples of the antioxidant may include (e.g., may be) 2,6-di-t-butyl-4-methylphenol, 3,5-di-t-butyl-4-hydroxybenzaldehyde, 2-t-butyl-4-methoxyphenol, 1,3,5-tris[(4-t-butyl-3-hydroxy-2,6-dimethylphenyl)methyl]-1,3,5-triazine-2,4,6-trione, [3-[3-(3,5-di-t-butyl-4-hydroxyphenyl) propanoyloxy]-2,2-bis[3-(3,5-di-t-butyl-4-hydroxyphenyl) propanoyloxymethyl]propyl]3-(3,5-di-t-butyl-4-hydroxyphenyl)propanoate, [3-[3-(3,5-di-t-butyl-4-hydroxyphenyl)propanoyloxy]-2,2-bis[3-(3,5-di-t-butyl-4-hydroxyphenyl)propanoyloxymethyl]propyl]3-(3,5-di-t-butyl-4-hydroxyphenyl)propanoate, octadecyl-3-(3,5-di-t-butyl-4-hydroxyphenyl)propanoate, tris(2,4-di-t-butylphenyl)phosphite, (4,4'-thio-bis(2-t-butyl-5-methylphenol, 2,2'-thiobis(4-methyl-6-t-butylphenol), 2,6-di-t-butyl-4-methylphenol, and/or the like, but embodiments of the present disclosure are not limited thereto.

Examples of the UV absorber may include (e.g., may be) 2-(3-t-butyl-2-hydroxy-5-methylphenyl)-5-chlorobenzotyriazole, alkoxybenzophenone bis(2,2,6,6-tetramethylpiperidine-4-yl)decandionate, 2-hydroperoxy-2-methylpropane, bis(3,3,5,5-tetramethylpiperidine-4-yl)decandionate, 4-methylhexyl-3-[3-(benzotyriazole-2-yl)-5-t-butyl-4-hydroxyphenyl]propanoate), and/or the like, but embodiments of the present disclosure are not limited thereto.

Examples of the anti-aggregation agent may include (e.g., may be) polyacrylic acid sodium and/or the like, but embodiments of the present disclosure are not limited thereto.

An amount of the stabilizer may be, based on 100 parts by weight of the ink composition, in a range of about 0.05 parts by weight to about 10 parts by weight, for example, about 0.1 parts by weight to about 5 parts by weight, or, about 0.1 parts by weight to about 3 parts by weight.

The viscosity of the ink composition may be 80 mPa·s or less at 25° C. For example, the viscosity may be in a range of about 1 mPa·s to about 80 mPa·s, and for example, about 5 mPa·s to about 40 mPa·s. The ink composition having the viscosity within these ranges may be suitable for manufacturing a film according to a solution process, such as an inkjet printing method.

The surface tension of the ink composition may be in a range of about 10 dynes/cm to about 40 dynes/cm at room temperature. The ink composition having the surface tension within this range may be suitable for manufacturing a film according to a solution process, such as an inkjet printing method.

The ink composition may pass through a filter having a pore size of 20 μm or less, in some embodiments, 5 μm or less.

Film

Hereinafter, a film formed utilizing the ink composition will be described in more detail.

A film may be formed by curing the ink composition. For example, the film may include a cured product of the ink composition.

In an embodiment, the film may be formed by acts (e.g., steps) including: providing the ink composition on a substrate to form a pattern thereon; and curing the pattern.

In an embodiment, the providing of the ink composition to form the pattern may be performed by a solution process. The solution process may include an inkjet printing method, a spin coating method, a slit coating method, a drop casting method, a casting method, a gravure coating method, a bar coating method, a roll coating method, a dip coating method, a spray coating method, a screen coating method, a flexo printing method, an offset printing method, or a nozzle printing method, but embodiments of the present disclosure are not limited thereto.

In an embodiment, the solution process may be performed by an inkjet printing method, but embodiments of the present disclosure are not limited thereto. For example, the ink composition may be provided in the form of micro-droplets on the substrate by the inkjet printing method. In some embodiments, micro-droplets of the ink composition may be sprayed on a set or predetermined area of the substrate. In some embodiments, the ink composition may be provided on the substrate to a thickness in a range of about 0.5 μm to about 20 μm by the inkjet printing method.

Because the ink composition has excellent or suitable inkjet ejection stability, the ink composition may be suitably utilized for the inkjet printing method.

To perform the inkjet printing method, an inkjet printer having an inkjet head mounted with a piezo-type or kind nozzle that applies pressure according to a voltage may be utilized.

In more detail, the ink composition may be ejected from the nozzle of the inkjet head onto the substrate.

Here, an ejection amount of the ink composition may be in a range of about 1 pL/time to about 80 pL/time, for example, about 1 pL/time to about 30 pL/time, or, about 1 pL/time to about 20 pL/time.

To minimize or reduce clogging of the nozzle and improve the degree of ejection precision, an aperture diameter of the inkjet head may be in a range of about 5 μm to about 50 μm, for example, about 10 μm to about 30 μm, but embodiments of the present disclosure are not limited thereto.

An ejection pressure of the inkjet head may be in a range of about $1,000\ s^{-1}$ to about $100,000\ s^{-1}$ based on a shear rate, but embodiments of the present disclosure are not limited thereto. In an embodiment, the shear rate upon ejection at the inkjet head may be in a range of about $1,000\ s^{-1}$ to about $100,000\ s^{-1}$.

A temperature at the time of ejection may be, although not particularly limited, in a range of about 10° C. to about 120° C., about 15° C. to about 60° C., about 15° C. to about 40° C., or about 20° C. to about 35° C., in terms of (e.g., in consideration of) suppressing crystallization of a material included in the ink composition.

In an embodiment, the curing of the pattern may be performed by a photocuring process or a thermosetting process. However, when an organic compound vulnerable to heat is adjacent to the pattern, a photocuring process may be preferred. In one or more embodiments, the curing of the pattern may be performed by irradiating light having an intensity in a range of about 1 W to about 500 W and/or a wavelength in a range of about 250 nm to about 450 nm, but embodiments of the present disclosure are not limited thereto.

In an embodiment, the substrate may be an electrode of a light-emitting device, but embodiments of the present disclosure are not limited thereto.

In an embodiment, the ink composition may be provided on an electrode to a thickness in a range of about 1 μm to about 100 μm, for example, about 5 μm to about 20 μm.

Electronic Apparatus

Hereinafter, an electronic apparatus including the above-described film will be described.

Another embodiment of the present disclosure provides an electronic apparatus including: the film; and a light-emitting device including a first electrode, a second electrode, and an interlayer between the first electrode and the second electrode.

In an embodiment, the electronic apparatus may include a liquid crystal display apparatus, an organic light-emitting display apparatus, or an inorganic light-emitting display apparatus.

For example, when the electronic apparatus further includes liquid crystal, the electronic apparatus may be a liquid crystal display apparatus. Here, the light-emitting device may act as a light source, and the film may be included outside the light-emitting device and the liquid crystal to act as a color conversion member.

In one or more embodiments, when the interlayer of the light-emitting device includes an emission layer, and the emission layer includes an organic material, the electronic apparatus may be an organic light-emitting display apparatus. Here, the light-emitting device may act as a light source, and the film may be included outside the light-emitting device to act as a color conversion member.

In one or more embodiments, when the interlayer of the light-emitting device includes an emission layer, and the emission layer includes an inorganic material, such as the film (e.g., formed of quantum dots), the electronic apparatus may be an inorganic light-emitting display apparatus. Here, the light-emitting device may act as a light source, and the film (e.g., formed of the ink composition) may be included outside the light-emitting device to act as a color conversion member.

The electronic apparatus may further include a thin-film transistor in addition to the above-described light-emitting device. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion allows light from the light-emitting device to be extracted to the outside, and concurrently (e.g., simultaneously) prevents or substantially prevents ambient air and moisture from penetrating into the light-emitting device. The sealing portion may be a sealing substrate including a transparent glass substrate and/or a plastic substrate. The sealing portion may be a thin-film encapsulation layer including at least one of an organic layer and/or an inorganic layer. When the sealing portion is a thin-film encapsulation layer, the electronic apparatus may be flexible.

Various suitable functional layers may be additionally arranged on the sealing portion according to the usage of the electronic apparatus. Examples of the functional layer may include (e.g., may be) a color filter, a color conversion layer, a touch screen layer, a polarizing layer, and/or the like. The touch screen layer may be a pressure-sensitive touch screen layer, a capacitive touch screen layer, and/or an infrared touch screen layer.

Description of FIG. 1

Hereinafter, an electronic apparatus 3 according to an embodiment will be described in more detail with reference to FIG. 1.

The electronic apparatus 3 includes a light-emitting device 320 and a first substrate 340.

A film may be included outside the light-emitting device 320 (that is, on a first electrode and/or a second electrode). For example, the film may be on the first substrate 340 arranged outside the light-emitting device 320. The first substrate 340 may act as a color conversion member, and the light-emitting device 320 may act as a light source.

The light-emitting device 320 may include a first electrode 321, a second electrode 323, and an interlayer 322 between the first electrode 321 and the second electrode 323.

The electronic apparatus 3 may be an organic light-emitting display apparatus. In this regard, the light-emitting device 320 may include an organic emission layer in the interlayer 322.

A pixel-defining layer 330 may be arranged on the first electrode 321. The pixel-defining layer 330 exposes a set or predetermined region of the first electrode 321, and the interlayer 322 may be arranged on the exposed region.

In an embodiment, one region 341 of the first substrate 340 may include the film. Here, the first substrate 340 may be arranged in a traveling direction of light emitted from the light-emitting device 320. For example, the film may be arranged outside the light-emitting device 320 and on the traveling direction of light emitted from the light-emitting device 320.

The film may absorb a first-color light and emit a second-color light. Accordingly, the first substrate 340 may be designed to absorb the first-color light and emit the second-color light selected from a wide color range.

In an embodiment, the first substrate 340 may further include a scatterer.

In an embodiment, the first substrate 340 may include a plurality of subpixel areas spaced apart from each other. The first substrate 340 may include: a first region emitting a first-color light; a second region emitting a second-color light; and/or a third region emitting a third-color light, wherein the first region, the second region, and/or the third region correspond to each of the plurality of subpixel areas, and the first-color light, the second-color light, and/or the third-color light may have different maximum emission wavelengths from one another. For example, the first-color light may be red light, the second-color light may be green light, and the third-color light may be blue light. At least one of the first region to the third region may correspond to the one region 341. The others not corresponding to the one region 341 among the first region to third region may be another region. The other region may not include (e.g., may exclude) the film, and may transmit light from a different light-emitting device.

In an embodiment, the first region may include red quantum dots, the second region may include green quantum dots, and the third region may not include (e.g., may exclude) quantum dots. The first region, the second region, and/or the third region may each further include a scatterer. Here, the third region may transmit light from the light-emitting device.

For example, the light-emitting device may emit a first light, the first region may absorb the first light and emit a first-first color light, the second region may absorb the first light and emit a second-first color light, and the third region may absorb the first light and emit a third-first color light. Here, the first-first color light, the second-first color light, and the third-first color light may have different maximum emission wavelengths from each other. For example, the first light may be blue light, the first-first color light may be red light, the second-first color light may be green light, and the third-first color light may be blue light.

In an embodiment, the first substrate 340 may further include a light-shielding pattern 344 between the one region 341 and the other region.

In an embodiment, the electronic apparatus 3 may further include a second substrate 310.

Figure 2:
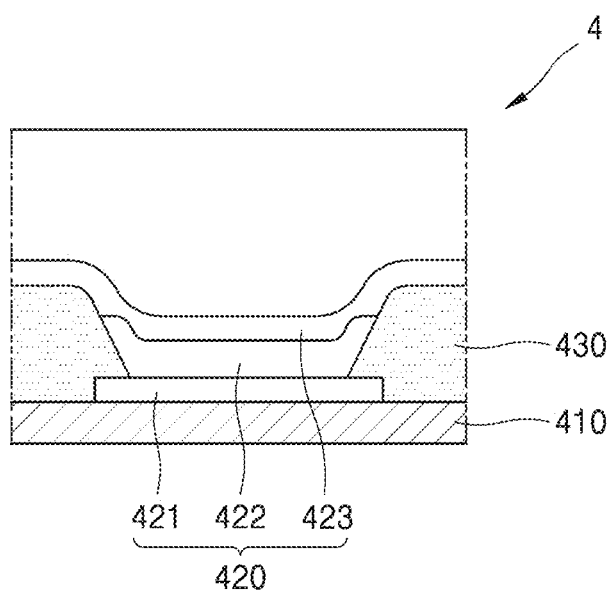
FIG. 2 is a schematic view of a light-emitting apparatus according to another embodiment.

Description of FIG. 2

Hereinafter, an electronic apparatus 4 according to an embodiment will be described in more detail with reference to FIG. 2.

The electronic apparatus 4 includes a first substrate 410 and a light-emitting device 420.

The light-emitting device 420 includes a first electrode 421, a second electrode 423, and an interlayer 422 between the first electrode 421 and the second electrode 423.

The film may be included in the interlayer 422, for example, in an emission layer included in the interlayer 422.

When an electric field is applied between the first electrode 421 and the second electrode 423, the film may be to emit visible light. Accordingly, the light-emitting device 420 may be designed to emit light having wavelengths in a wide color range.

The interlayer 422 may further include an auxiliary layer between the emission layer and the first electrode and/or between the emission layer and the second electrode. The auxiliary layer may directly contact the emission layer. The auxiliary layer may improve thin-film characteristics of the emission layer.

The interlayer 422 may further include a first charge transport region between the emission layer and the first electrode and/or a second charge transport region between the emission layer and the second electrode.

Figure 3:
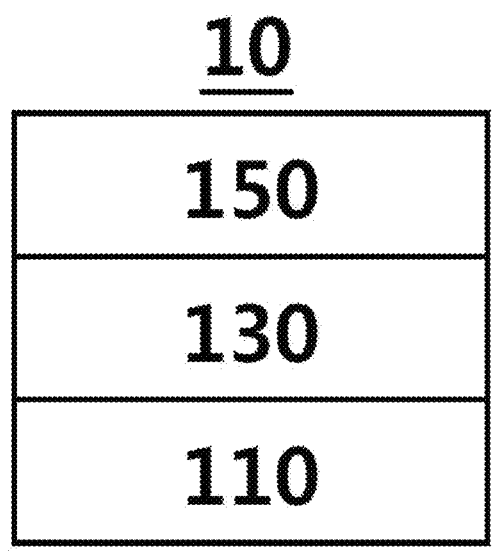
FIG. 3 is a schematic view of a light-emitting device according to an embodiment.

Description of FIG. 3

FIG. 3 is a schematic cross-sectional view of a light-emitting device 10. The light-emitting device 10 includes a first electrode 110, an interlayer 130, and a second electrode 150.

Hereinafter, a structure and a manufacturing method of the light-emitting device 10 will be described in more detail with reference to FIG. 3.

First Electrode 110

In FIG. 3, a substrate may be additionally arranged under the first electrode 110 or above the second electrode 150.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

Interlayer 130

The interlayer 130 is arranged on the first electrode 110. The interlayer 130 may include an emission layer.

The interlayer 130 refers to a single layer and/or a plurality of layers arranged between the first electrode 110 and the second electrode 150 in the light-emitting device 10. A material included in the interlayer 130 may be an organic material and/or an inorganic material.

The interlayer 130 may further include a hole transport region between the first electrode 110 and the emission layer, and an electron transport region between the emission layer and the second electrode 150.

The interlayer 130 may further include, in addition to various suitable organic materials, a metal-containing compound, such as an organometallic compound, an inorganic material, such as a quantum dot, and/or the like.

In an embodiment, the interlayer 130 may include: i) two or more emitting units sequentially stacked between the first electrode 110 and the second electrode 150; and ii) a charge generation layer arranged between the two or more emitting units. When the interlayer 130 includes two or more emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material; ii) a single-layered structure consisting of a single layer including (e.g., consisting of) a plurality of different materials; or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituent layers of each structure are stacked sequentially from the first electrode 110 in the respective stated order.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

Emission Layer in Interlayer 130

When the light-emitting device 10 is a full color light-emitting device, the emission layer may include a plurality of emission layers emitting different colors according to individual subpixels.

For example, the emission layer may be patterned into a first color emission layer, a second color emission layer, and a third color emission layer, according to individual subpixels.

In an embodiment, at least one emission layer among the first color emission layer to the third color emission layer may include a film formed utilizing the ink composition. For example, the first color emission layer may be an inorganic emission layer including quantum dots, and the second color emission layer and the third color emission layer may each be an organic emission layer including an organic compound. In this regard, the first color to the third color may be different from one another, and for example, may have different maximum emission wavelengths from one another. The first color to the third color may produce white light when combined with one another.

In one or more embodiments, the first color emission layer, the second color emission layer, and the third color emission layer may each be an organic emission layer including an organic compound.

In one or more embodiments, the emission layer may further include a fourth color emission layer, and at least one emission layer of the first color emission layer to the fourth color emission layer may be an inorganic emission layer including quantum dots, and the others may each be an organic emission layer including an organic compound. As such, other various suitable modifications may be provided. In this regard, the first color to the fourth color may be different colors, and for example, the first color to the fourth color may have different maximum emission wavelengths from one another. The first color to the fourth color may produce white light when combined with one another.

In one or more embodiments, the light-emitting device may have a stacked structure in which two or more emission layers emitting light of identical or different colors contact each other or are separated from each other. At least one emission layer of the two or more emission layers may be an inorganic emission layer including quantum dots, and the others may each be an organic emission layer including an organic compound. As such, other various suitable modifications may be provided. In some embodiments, the light-emitting device may include the first color emission layer and the second color emission layer, wherein the first color and the second color may be identical to or different from each other. For example, when the first color and the second color are identical to each other, the first color and the second color may each be blue. For example, when the first color and the second color are different from each other, the first color and the second color may be combined to produce white light. For example, when the first color and the second color are different from each other, the first color may be blue, and the second color may be green or red.

When the emission layer is an organic emission layer, the emission layer may include a host and a dopant. The dopant may include a phosphorescent dopant, a fluorescent dopant, a delayed fluorescence dopant, or any combination thereof.

An amount of the host in the emission layer may be greater than that of the dopant in the emission layer. In an embodiment, the amount of the dopant in the emission layer may be in a range of about 0.01 parts by weight to about 15 parts by weight based on 100 parts by weight of the host.

When the emission layer is an inorganic emission layer, the emission layer may include quantum dots. In some embodiments, the emission layer may include a film formed utilizing the ink composition.

In one or more embodiments, the emission layer may include a delayed fluorescence material. The delayed fluorescence material may act as the host or the dopant in the emission layer, and depending on the purpose, may be a delayed fluorescence host or a delayed fluorescence dopant.

A thickness of the emission layer may be in a range of about 100 Å to about 1,000 Å, for example, about 200 Å to about 600 Å. When the thickness of the emission layer is within these ranges, excellent or suitable luminescence characteristics may be obtained without a substantial increase in driving voltage.

Electron Transport Region in Interlayer 130

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituent layers of each structure are sequentially stacked from the emission layer in the respective stated order.

A thickness of the electron transport region may be in a range of about 160 Å to about 5,000 Å, for example, from about 100 Å to about 4,000 Å. When the electron transport region includes a buffer layer, a hole blocking layer, an electron control layer, an electron transport layer, or any combination thereof, a thickness of the buffer layer, the hole blocking layer, and/or the electron control layer may be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

Second Electrode 150

The second electrode 150 is arranged on the above-described interlayer 130. The second electrode 150 may be a cathode, which is an electron injection electrode, and as a material for forming the second electrode 150, a metal, an alloy, an electrically conductive compound, or any combination thereof, each having a low work function, may be utilized.

The second electrode 150 may have a single-layered structure or a multi-layered structure including a plurality of layers.

Capping Layer

A first capping layer may be arranged outside the first electrode 110 (e.g., on the side opposite to the side facing the second electrode 150), and/or a second capping layer may be arranged outside the second electrode 150 (e.g., on the side opposite to the side facing the first electrode 110). In some embodiments, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

In an embodiment, light generated in the emission layer of the interlayer 130 of the light-emitting device 10 may be extracted (e.g., emitted) toward the outside through the first electrode 110, which is a semi-transmissive electrode or a transmissive electrode, and the first capping layer. In one or more embodiments, light generated in the emission layer of the interlayer 130 of the light-emitting device 10 may be extracted (e.g., emitted) toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 may be increased, so that the luminescence efficiency of the light-emitting device 10 may also be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

Electronic Apparatus

The light-emitting device may be included in various suitable electronic apparatuses. In an embodiment, the electronic apparatus including the light-emitting device may be a display apparatus, a light-emitting apparatus, an authentication apparatus, and/or the like.

The electronic apparatus (for example, a light-emitting apparatus) may further include, in addition to the light-emitting device, i) a color filter, ii) a color conversion layer, or iii) both (e.g., simultaneously) a color filter and a color conversion layer. The color filter and/or the color conversion layer may be arranged in at least one traveling direction of light emitted from the light-emitting device. For example, light emitted from the light-emitting device may be blue light or white light. Details for the light-emitting device are the same as described herein. In an embodiment, the color conversion layer may include quantum dots, and may be a film formed utilizing the above-described ink composition.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The electronic apparatus may further include a thin-film transistor in addition to the above-described light-emitting device. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be arranged between the color filter and the light-emitting device and/or between the color conversion layer and the light-emitting device. The sealing portion allows light from the light-emitting device to be extracted (e.g., emitted) to the outside, and concurrently (or simultaneously) prevents or substantially prevents ambient air and moisture from penetrating into the light-emitting device. The sealing portion may be a sealing substrate including a transparent glass substrate or a plastic substrate. The sealing portion may be a thin-film encapsulation layer including at least one of an organic layer and/or an inorganic layer. When the sealing portion is a thin-film encapsulation layer, the electronic apparatus may be flexible.

Various suitable functional layers may be additionally arranged on the sealing portion, in addition to the color filter and/or the color conversion layer, according to usage of the electronic apparatus. Examples of the functional layer may include (e.g., may be) a touch screen layer, a polarizing layer, and/or like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, and/or the like).

The authentication apparatus may further include, in addition to the light-emitting device as described above, a biometric information collector.

The electronic apparatus may be applied to various suitable displays, light sources, lighting (e.g., lighting apparatuses), personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Manufacturing Method

The layers included in the hole transport region, the emission layer, and the layers included in the electron transport region may be formed in a certain region by utilizing various suitable methods such as vacuum deposition, spin coating, casting, Langmuir-Blodgett (LB) deposition, ink-jet printing, laser-printing, laser-induced thermal imaging, and/or the like.

When the layers included in the hole transport region, the emission layer, and the layers included in the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec, depending on a material to be included in a layer to be formed and the structure of a layer to be formed.

EXAMPLES

Preparation Example 1

Preparation of Quantum Dot Including Ligand on Surface Thereof

Referring to Chem. Mater. 2017, 29, 6893-6899, Part 2.2, the content of which is incorporated herein by reference in its entirety, a dispersion including InP/ZnSe/ZnS quantum dots was prepared. The dispersion was subjected to centrifugation twice, each utilizing acetone and ethanol, and then, vacuum dried, so as to obtain powder of InP/ZnSe/ZnS quantum dots including oleic acid ligands on a surface thereof.

Figure 4:
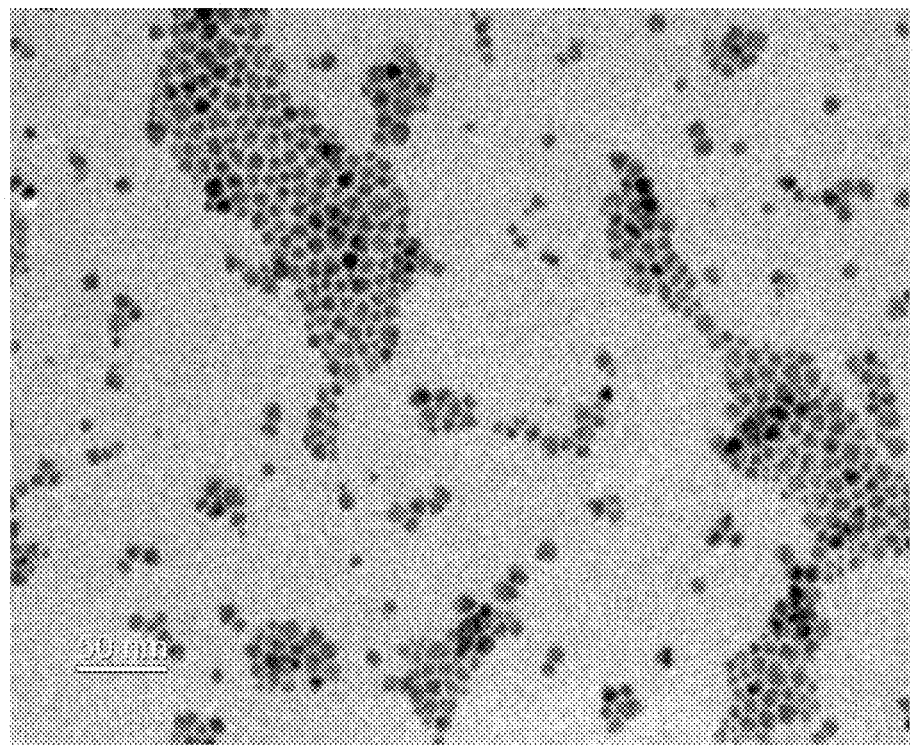
FIG. 4 is an SEM image of quantum dots obtained in Preparation Example 1.

100 g of the quantum dot powder was dissolved in a solution containing 125 g of toluene and 125 g of hexane, and 30 g of methoxy tetra(ethylene glycol) propionic acid as a ligand including a polar moiety was added thereto. Then, under a nitrogen atmosphere, the reaction temperature was raised to 80° C., and a reaction was allowed (e.g., carried out) for 15 hours while maintaining the temperature, so as to obtain quantum dots including ligands on a surface thereof. Hexane was added to the resultant quantum dots including the ligands on the surface thereof, and a centrifugation process was performed thereon for precipitation. The precipitate was purified and dispersed again in acetone. An excess of hexane was added again thereto for precipitation, and the precipitate was then purified and dried. FIG. 4 shows an scanning electron microscope (SEM) image of the quantum dots thus obtained including the ligands on the surface thereof.

Preparation Example 2

Preparation of Scatterer Dispersion 50 parts by weight of titanium dioxide pigment particles having an average particle diameter (D50) of 170 nm as the scatterer particles, 45 parts by weight of OXT-221 (by TOAGOSEI) as a second monomer, and 5 parts by weight of EFKA (by BASF) as a dispersant were added to a beads mill machine to be stirred for 4 hours, so as to prepare a scatterer dispersion.

Preparation Example 3

Preparation of Ink Composition of Examples 1 to 4 and Comparative Examples 1 to 5

The quantum dots including the ligands on the surface thereof as prepared according to Preparation Example 1, a first monomer, a second monomer, a third monomer, a polymerization initiator, the scatterer dispersion prepared according to Preparation Example 2, and other components were added at ratios shown in Tables 1 and 2 and mixed utilizing a mixer, so as to prepare ink compositions of Examples 1 to 4 and Comparative Examples 1 to 5.

I1: 2,6-di-t-butyl-4-methylphenol (by Merck);

J1: hexanediol diacrylate (by Miwon Commercial Co., Ltd.); J2: dipentaerythritol hexaacrylate (by Nippon Kayaku); and J3: Phoret ZAH-106 (by Soken) including 65 parts by weight of propylene glycol methyl ether acetate solvent.

Evaluation Example

Viscosity, storage stability, light conversion rate, light absorption rate, adhesion, out-gassing, and tack-free time of each of the ink compositions were measured, and results thereof are shown in Table 3. Here, the viscosity, storage stability, light conversion rate, light absorption rate, adhe-

TABLE 1

| | Quantum dot (parts by weight) | First monomer (parts by weight) | Second monomer (parts by weight) | Third monomer (parts by weight) | Photopolymerization initiator (parts by weight) | Scatterer dispersion (parts by weight) | Surfactant (parts by weight) | Adhesion promoter (parts by weight) | Sensitizer (parts by weight) | Antioxidant (parts by weight) |
|---|---|---|---|---|---|---|---|---|---|---|
| Example 1 | A1 (35) | B2 (24) | B3 (24) | B1 (10) | C1 (3) | — | F1 (2) | G1 (1) | H1 (0.5) | I1 (0.5) |
| Example 2 | A1 (35) | B2 (24) | B3 (16) | B1 (10) | C1 (3) | E1 (8) | F1 (2) | G1 (1) | H1 (0.5) | I1 (0.5) |
| Example 3 | A1 (35) | B4 (24) | B3 (16) | B1 (10) | C1 (3) | E1 (8) | F1 (2) | G1 (1) | H1 (0.5) | I1 (0.5) |
| Example 4 | A1 (35) | B2 (31) | B5 (10) | B1 (10) | C1 (3) | E1 (8) | F1 (2) | G1 (1) | H1 (0.5) | I1 (0.5) |
| Comparative Example 1 | AX (35) | B2 (19) | B3 (24) | B1 (15) | C1 (3) | — | F1 (2) | G1 (1) | H1 (0.5) | I1 (0.5) |
| Comparative Example 2 | A1 (35) | B2 (48) | — | B1 (10) | C1 (3) | — | F1 (2) | G1 (1) | H1 (0.5) | I1 (0.5) |
| Comparative Example 3 | A1 (35) | — | B3 (50) | — | C1 (3) | E1 (8) | F1 (2) | G1 (1) | H1 (0.5) | I1 (0.5) |

TABLE 2

| | Quantum dot (parts by weight) | Binder (parts by weight) | Acryl-based first monomer (parts by weight) | Acryl-based second monomer (parts by weight) | Photopolymerization initiator (parts by weight) | Scatterer dispersion (parts by weight) | Surfactant (parts by weight) | Adhesion promoter (parts by weight) | Sensitizer (parts by weight) | Antioxidant (parts by weight) |
|---|---|---|---|---|---|---|---|---|---|---|
| Comparative Example 4 | A1 (35) | — | J1 (50) | J2 (8) | C2 (3) | — | F1 (2) | G1 (1) | H1 (0.5) | I1 (0.5) |
| Comparative Example 5 | A1 (35) | J3 (20) | J1 (30) | J2 (8) | C2 (3) | — | F1 (2) | G1 (1) | H1 (0.5) | I1 (0.5) |

In Tables 1 and 2, numbers in parentheses represent the unit, parts by weight.

In Tables 1 and 2, the signs and letters represent the following:
A1: quantum dots of Preparation Example 1; AX: quantum dots including on surface thereof oleic acid ligands;
B1: Celloxide 2021P (Daicell); B2: neopentylglycol diglycidyl ether (by Kukdo Finechem Co., Ltd.); B3: OXT-221 (by TOAGOSEI);
B4: ethyleneglycol diglycidyl ether (by Kukdofine Chem Co., Ltd.); B5: OXT-121 (Toagosei);
C1: OMNICAT 270 (IGM Resin); C2: OMNIRAD819 (IGM Resin);
E1: titanium dioxide dispersion prepared by the method of Preparation Example 2;
F1: MEGAFACE F-552 (by DIC);
G1: KBM-403 (by Shin Etsu);
H1: 9,10-dimethoxyanthracene (by Merck);

sion, out-gassing, and tack-free time were measured by respective methods described:

(1) Measurement of Viscosity

The viscosity of each of the ink compositions of Examples 1 to 4 and Comparative Examples 1 to 5 was measured utilizing a viscometer (Brookfield Model DV-II with Spindle RV-2) at room temperature (25° C.).

(2) Measurement of Storage Stability

Regarding the ink compositions of Examples 1 to 4 and Comparative Examples 1 to 5, the initial viscosity (e.g., of freshly prepared ink compositions) was measured utilizing a viscometer (Brookfield Model DV-II with Spindle RV-2) at room temperature (25° C.). The ink compositions were then stored for 4 weeks at room temperature (25° C.) while being stirred with a shaker in an environment shielded from ultraviolet light. Then, the viscosity of each of the ink compositions was measured again at room temperature (25° C.) and a change in the viscosity thereof over time was observed. Here, the viscosity changed within 10% was denoted by O, and the viscosity changed in 10% or more was denoted by X.

(3) Measurement of Light Conversion Rate and Light Absorption Rate

Each of the ink compositions of Examples 1 to 4 and Comparative Examples 1 to 5 was applied to a glass substrate for display having a size of 50 mm (width)×50 nm (length)×0.5 mm (thickness) to a thickness of 10 μm by adjusting the number of rotations utilizing a spin coater. Then, in the atmosphere environment, a film was formed by irradiating the glass substrate with ultraviolet rays having a wavelength of 395 nm and curing the ink composition. The glass substrate was cut so that the central portion of the film had a size of 20 mm (width)×20 mm (length). Afterwards, initial conversion rate of blue light was measured (step 1). Here, the conversion rate of blue light was measured with an integral hemispherical film-type or kind measuring instrument (manufactured by Otsuka). In more detail, blue light having a wavelength in a range of about 450 nm to about 460 nm was applied to the film formed utilizing the ink composition, and all green light emitted upward was captured and calculated as an integral value. Then, the increase in light that was converted to green was calculated in relative to the decrease in light upon the absorption of blue light, so as to measure the light conversion rate (green/blue). At the same time, the light absorption of blue light was also measured utilizing the same measuring instrument. Here, the light conversion rate of 30% or more was denoted by O, the light conversion rate of less than 30% was denoted by X, the light absorption rate of 90% or more was denoted by O, and the light absorption rate of less than 90% was denoted by X.

(4) Measurement of Adhesion

Each of the ink compositions of Examples 1 to 4 and Comparative Examples 1 to 5 was applied to a glass substrate for display having a size of 50 mm (width)×50 nm (length)×0.5 mm (thickness) to a thickness of 10 μm by adjusting the number of rotations utilizing a spin coater. Then, a film was formed by irradiating the glass substrate with ultraviolet rays having a wavelength of 395 nm. After exposure of the film thereto for 5 minutes, a cross-cut testing (as per ASTM-D3359) was performed thereon. In more detail, on a specimen, 11 horizon lines and 11 vertical lines were drawn at intervals of 1 mm with a knife so that 100 square grids each having a size of 1 mm (width)×1 mm (length) were formed. Then, a piece of 610 scotch tape (manufactured by 3M company) was applied to the grid-formed surface. When the tape was peeled off, the state of the detached grid surface was measured and evaluated according to the following criteria.

Adhesion Force Evaluation as Per ASTM-03359

5B: there is no detached surface (e.g., no detachment of the ink film from the glass substrate surface)

4B: the area of the detached surface (e.g., the area of the ink film detached from the glass substrate surface) is within 5% of the total area 3B: the detached surface (e.g., the area of the ink film detached from the glass substrate surface) is in a range of 5% to 15% of the total area 2B: the detached surface (e.g., the area of the ink film detached from the glass substrate surface) is in a range of 15% to 35% of the total area 1B: the detached surface (e.g., the area of the ink film detached from the glass substrate surface) is in a range of 35% to 65% of the total area 0B: almost all surfaces were detached (e.g., almost the whole ink film was detached from the glass substrate surface)

Regarding the adhesion evaluation results, ASTM of 3B or greater was denoted by O, ASTM between 2B and 1B was denoted by Δ, and ASTM of 0B was denoted by x.

(5) Measurement of Out-Gassing 10 mg of each of the ink compositions of Examples 1 to 4 and Comparative Examples 1 to 5 was sealed in a vial, cured by UV irradiation, and heated at 180° C. for 30 minutes in a HSS-GC apparatus (manufactured by Agilent). Then, the out-gassing was quantified by gas chromatography, and the quantified value was calculated in ppm by toluene conversion. The measured quantity of 500 ppm or less was denoted by O, the measured quantity of 1,000 ppm or less was denoted by Δ, and the measured quantity of greater than 1,000 ppm was denoted by X.

(6) Measurement of Tack-Free Time

Each of the ink compositions of Examples 1 to 4 and Comparative Examples 2 and 3 was irradiated with 1 J/cm$^2$ of UV at the intensity of 1,000 mW/cm$^2$, and the tack-free time of the cured compositions was respectively measured. First, each of the ink compositions was spin-coated to a thickness of 10 μm, and cured by UV irradiation as described above. When a surface of a film formed utilizing the ink composition was touched immediately after the completion of curing process, the time until the curing proceeds sufficiently so that the stickiness disappears and there is no smearing of the ink composition at all was defined as the tack-free time, and the tack-free time for the ink compositions was respectively measured. The immediate tack-free time (less than 1 second) was classified into Grade ⊙ the tack-free time of less than 1 minute was classified into Grade O, the tack-free time of 5 minutes or more was classified into Grade Δ, and the tack-free time of 30 minutes or more was classified into Grade X.

When each of the ink compositions of Comparative Examples 4 and 5 was irradiated with UV in the air and nitrogen atmosphere, the surface curing of the ink compositions did not proceed well, and thus these ink compositions received Grade X. Meanwhile, when the ink composition of Comparative Example 4 was irradiated with UV in the nitrogen atmosphere, the curing was smoothly performed.

TABLE 3

|  | Viscosity (mPa · s) | Storage stability | Light conversion rate | Light absorption rate | Adhesion | Out-gassing | Tack-free time |
|---|---|---|---|---|---|---|---|
| Example 1 | 35.9 | O | O | O | O | O | O |
| Example 2 | 37.1 | O | O | O | O | O | O |
| Example 3 | 41.1 | O | O | O | O | O | O |
| Example 4 | 55.9 | O | O | O | O | O | O |
| Comparative Example 1 | failed to evaluate physical properties of the ink compositions due to poor dispersion state of quantum dots | | | | | | |

TABLE 3-continued

| | Viscosity (mPa·s) | Storage stability | Light conversion rate | Light absorption rate | Adhesion | Out-gassing | Tack-free time |
|---|---|---|---|---|---|---|---|
| Comparative Example 2 | 38.8 | ○ | ○ | ○ | ○ | X | ○ |
| Comparative Example 3 | 10.2 | ○ | ○ | ○ | ○ | ○ | Δ |
| Comparative Example 4 | 34.6 | ○ | ○ | ○ | X | X | X (⊚*) |
| Comparative Example 5 | 43.2 | ○ | ○ | ○ | Δ | X | X (X*) |

In Table 3,
*indicates a value when curing was performed in the nitrogen atmosphere.

As described above, according to the one or more embodiments, an electronic apparatus having high efficiency and/or high color purity may be provided. The scope of the present disclosure is not limited by such effects.

It should be understood that embodiments described herein should be considered in a descriptive sense only and not for purposes of limitation. Descriptions of features or aspects within each embodiment should typically be considered as available for other similar features or aspects. While one or more embodiments have been described with reference to the drawings, it will be understood by those of ordinary skill in the art that various suitable changes in form and details may be made therein without departing from the spirit and scope as defined by the following claims, and equivalents thereof.

What is claimed is:

1. An ink composition comprising:
a quantum dot comprising one or more ligands on a surface thereof;
a first monomer comprising one or more epoxy groups;
a second monomer comprising one or more oxetane groups; and
a third monomer comprising one or more epoxy groups,
wherein,
the one or more ligands comprise one or more polar moieties,
the first monomer is represented by Formula 1-1,
the third monomer is represented by Formula 1-2, and
the third monomer is about 20 parts by weight to about 500 parts by weight in amount based on 100 parts by weight of the first monomer:

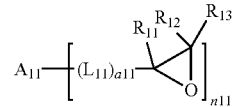

Formula 1-1

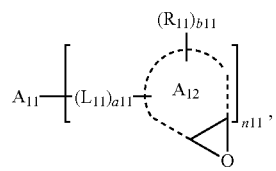

Formula 1-2 and
wherein, in Formulae 1-1 and 1-2,
$A_{11}$ is a linear or branched $C_1$-$C_{20}$ alkyl group or a linear or branched $C_1$-$C_{20}$ alkenyl group,
$A_{12}$ is a cyclic $C_1$-$C_{20}$ alkyl group or a cyclic $C_1$-$C_{20}$ alkenyl group,
$L_{11}$ is

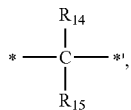

*—O—*', or

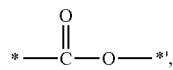

a11 is 0, 1, 2, 3, 4, 5, 6, 7, 8, 9, or 10,
$R_{11}$ to $R_{15}$ are each independently hydrogen, deuterium, a halogen, or a linear, branched, or cyclic $C_1$-$C_{20}$ alkyl group,
b11 is an integer from 1 to 12,
n11 is 1, 2, 3, 4, or 5, and
* and *' each indicate a binding site to a neighboring atom.

2. The ink composition of claim 1, wherein the first monomer comprises 1, 2, 3, 4, or 5 epoxy groups, and the second monomer comprises 1, 2, 3, 4, or 5 oxetane groups.

3. The ink composition of claim 1, wherein the second monomer is represented by Formula 2-1 or Formula 2-2:

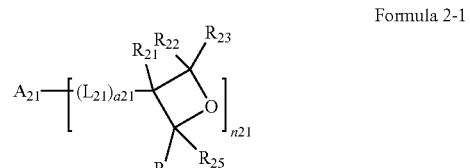

Formula 2-1

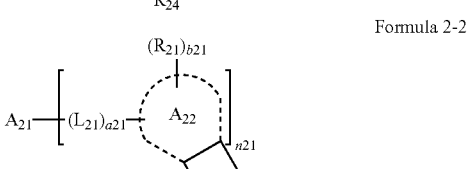

Formula 2-2 and wherein, in Formulae 2-1, and 2-2, $A_{21}$ is a linear, branched, or cyclic $C_1$-$C_{20}$ alkyl group; a linear, branched, or cyclic alkenyl group; or a $C_6$-$C_{20}$ aryl group, $A_{22}$ is a cyclic $C_1$-$C_{20}$ alkyl group or a cyclic $C_1$-$C_{20}$ alkenyl group, $L_{21}$ is

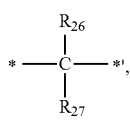

*—O—*', or

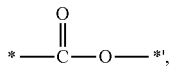

a21 is 0, 1, 2, 3, 4, 5, 6, 7, 8, 9, or 10, $R_{21}$ to $R_{27}$ are each independently hydrogen, deuterium, a halogen, or a linear, branched, or cyclic $C_1$-$C_{20}$ alkyl group, b21 is an integer from 1 to 12, n21 is 1, 2, 3, 4, or 5, and

* and *' each indicate a binding site to a neighboring atom.

4. The ink composition of claim 1, wherein an amount of the first monomer is, based on 100 parts by weight of the ink composition, about 20 parts or more by weight and less than about 70 parts by weight, and an amount of the second monomer is, based on 100 parts by weight of the ink composition, about 5 parts or more by weight and less than about 90 parts by weight.

5. The ink composition of claim 1, wherein an amount of the second monomer is, based on 100 parts by weight of the first monomer, in a range of about 20 parts by weight to about 350 parts by weight.

6. The ink composition of claim 1, wherein the ink composition has a viscosity of 80 mPa's or less at 25° C.

7. The ink composition of claim 1, wherein the one or more polar moieties comprise an oxyalkylene group.

8. The ink composition of claim 1, wherein the one or more ligands and the quantum dot are chemically bonded via at least one group selected from the group consisting of a hydroxy group, a mercapto group, a carboxyl group, an ester group, and a phosphoric acid group.

9. The ink composition of claim 1, wherein the one or more ligands comprise a linear, branched, or cyclic $C_1$-$C_{20}$ alkyl group; a linear, branched, or cyclic $C_1$-$C_{20}$ alkenyl group; a $C_6$-$C_{20}$ aryl group; or a $C_1$-$C_{20}$ heteroaryl group.

10. The ink composition of claim 1, further comprising a polymerization initiator, wherein the polymerization initiator comprises sulfonium or iodonium.

11. The ink composition of claim 1, wherein the ink composition further comprises a solvent in an amount of less than 2 parts by weight based on 100 parts by weight of the ink composition.

12. An electronic apparatus comprising:
a film formed utilizing the ink composition of claim 1; and
a light-emitting device comprising a first electrode, a second electrode, and an interlayer between the first electrode and the second electrode.

13. The electronic apparatus of claim 12, wherein the film is outside the light-emitting device and in a traveling direction of light emitted from the light-emitting device.

14. The electronic apparatus of claim 13, wherein a first region of the film comprises the quantum dot, and
the quantum dot is to absorb a first-color light and emit a second-color light.

15. The electronic apparatus of claim 14, wherein the film further comprises a second region distinct from the first region, and the second region comprises a scatterer, and does not comprise the quantum dot.

16. The electronic apparatus of claim 12, wherein the interlayer comprises the film.

17. The electronic apparatus of claim 12, further comprising a thin-film transistor, wherein
the thin-film transistor comprises a source electrode and a drain electrode, and the first electrode of the light-emitting device is electrically connected to the source electrode or the drain electrode of the thin-film transistor.

* * * * *